United States Patent [19]
Hutchins

[11] Patent Number: 5,442,315
[45] Date of Patent: Aug. 15, 1995

[54] BIT STREAM RATE ASYNCHRONOUS DIGITAL PHASE-LOCKED LOOP

[75] Inventor: Robert A. Hutchins, Tucson, Ariz.

[73] Assignee: International Business Machines Corporation, Armonk, N.Y.

[21] Appl. No.: 97,503

[22] Filed: Jul. 27, 1993

[51] Int. Cl.$^6$ .......................... H03K 1/00; H03K 5/18
[52] U.S. Cl. ........................................ 327/159; 327/1; 327/141; 327/12
[58] Field of Search .................... 328/155, 63, 72, 133; 307/269, 232, 295

[56] References Cited

U.S. PATENT DOCUMENTS

| | | | |
|---|---|---|---|
| 3,646,452 | 2/1972 | Horowitz et al. | 307/269 |
| 3,883,817 | 5/1975 | Cliff | 331/1 A |
| 4,210,776 | 7/1980 | Van Meter | 331/1 A |
| 4,360,926 | 11/1982 | Hedin et al. | 375/120 |
| 4,363,002 | 12/1982 | Fuller | 331/1 A |
| 4,374,438 | 2/1983 | Crowley | 331/17 |
| 4,596,964 | 6/1986 | Quaranta | 331/1 A |
| 4,802,009 | 1/1989 | Hartmeier | 358/159 |
| 4,855,683 | 8/1989 | Troudet et al. | 331/1 A |
| 4,930,142 | 5/1990 | Whiting et al. | 331/1 A |
| 5,057,794 | 10/1991 | Shih | 331/1 A |

Primary Examiner—William L. Sikes
Assistant Examiner—Fetsum Abraham
Attorney, Agent, or Firm—Manny W. Schecter; Andrew J. Dillon

[57] ABSTRACT

A system and method for estimating input phase for bit cells recovered from run length limited code where the bits cells have a nominal duration allows use of sampling rate as low as the nominal data rate in an all digital phase-locked loop. For the all digital phase-locked loop, a clock generates sample cells of a fixed duration. The sample cell phase contribution corresponding to a proportion of the fixed duration to the nominal duration is calculated and added to an accumulated phase value with each successive sample cell. For each sample cell, an input phase estimate is made from the accumulated phase value and timing information for any bit cell event occurring within the sample cell. Finally the input phase estimate information is used to adjust an accumulated phase value for the next sample cell.

14 Claims, 19 Drawing Sheets

Fig. 19

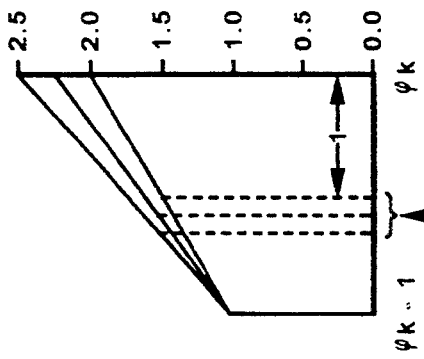

DRU Logic

$(2 < \varphi k < 3)(0 < \varphi k - 1 < 1)$: Two Output Clocks $(2 < \varphi k < 3)(0 < \varphi k - 1 < 1)$ (PulseDet = 0)(DClk1- = 0)(DClk2- = 0)
(PulseDet = 0)(DClk1- = 0)(DClk2- = 1)
(PulseDet = 0)(DClk1- = 1)(DClk2- = 0)
(PulseDet = 0)(DClk1- = 1)(DClk2- = 1)
(PulseDet = 1)(DClk1- = 0)(DClk2- = 0)(1/2 < DP < 3/2)
(PulseDet = 1)(DClk1- = 0)(DClk2- = 1)(1/2 < DP < 3/2)
(PulseDet = 1)(DClk1- = 1)(DClk2- = 0)(3/2 < DP < 5/2)
(PulseDet = 1)(DClk1- = 1)(DClk2- = 1)(3/2 < DP < 5/2)
(PulseDet = 1)(DClk1- = 0)(DClk2- = 0)(3/2 < DP < 5/2)
(PulseDet = 1)(DClk1- = 0)(DClk2- = 1)(3/2 < DP < 5/2)

(PulseDet = 1)(DP < 1/2)
(PulseDet = 1)(DClk1- = 1)(DClk2- = 0)(5/2 < DP < 7/2)
(PulseDet = 1)(DClk1- = 1)(DClk2- = 1)(5/2 < DP < 7/2)
(PulseDet = 1)(DClk1- = 0)(DClk2- = 0)(5/2 < DP < 7/2)
(PulseDet = 1)(DClk1- = 0)(DClk2- = 1)(5/2 < DP < 7/2)

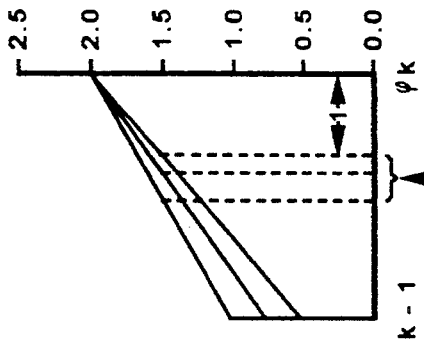

| PClk | PData | DClk1+ | DClk2+ |
|---|---|---|---|
| 1 | 0 | 0 | 0 |
| 1 | 0 | 0 | 0 |
| 1 | 1 | 0 | 0 |
| 1 | 1 | 0 | 0 |
| 1 | 0 | 0 | 0 |
| 1 | 1 | 1 | 0 |
| 1 | 1 | 1 | 0 |
| 1 | 0 | 1 | 0 |
| 1 | 1 | 1 | 0 |
| 1 | 0 | 1 | 0 |
| 1 | 1 | 0 | 0 |
| 1 | 0 | 0 | 1 |
| 1 | 0 | 0 | 1 |
| 1 | 1 | 0 | 1 |
| 1 | 1 | 0 | 1 |

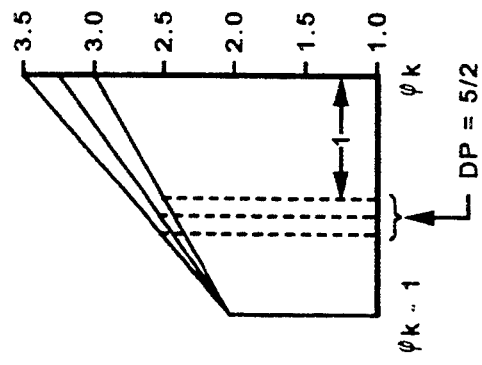

DRU Logic $(3 < \phi_k < 4)(1 < \phi_{k-1} < 2)$: Two Output Clocks (PulseDet = 0)(DClk1- = 0)(DClk2- = 0)(3/2 < DP < 5/2)
(PulseDet = 0)(DClk1- = 0)(DClk2- = 1)(3/2 < DP < 5/2)
(PulseDet = 0)(DClk1- = 1)(DClk2- = 0)(5/2 < DP < 7/2)
(PulseDet = 0)(DClk1- = 1)(DClk2- = 1)(5/2 < DP < 7/2)
(PulseDet = 1)(DClk1- = 0)(DClk2- = 0)(5/2 < DP < 7/2)
(PulseDet = 1)(DClk1- = 0)(DClk2- = 1)(5/2 < DP < 7/2)
(PulseDet = 1)(DClk1- = 1)(DClk2- = 0)(5/2 < DP < 7/2)
(PulseDet = 1)(DClk1- = 1)(DClk2- = 1)(5/2 < DP < 7/2)

* (PulseDet = 1)(1/2 < DP < 3/2)
* (PulseDet = 1)(DClk1- = 0)(DClk2- = 0)(7/2 < DP)
* (PulseDet = 1)(DClk1- = 0)(DClk2- = 1)(7/2 < DP)
* (PulseDet = 1)(DClk1- = 1)(DClk2- = 0)(7/2 < DP)
* (PulseDet = 1)(DClk1- = 1)(DClk2- = 1)(7/2 < DP)

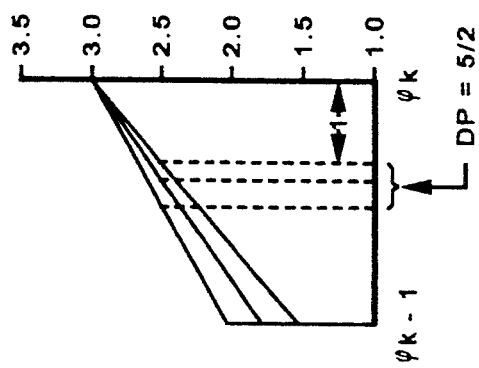

Fig. 20

BIT STREAM RATE ASYNCHRONOUS DIGITAL PHASE-LOCKED LOOP

BACKGROUND OF THE INVENTION

1. Technical Field

This invention relates to recovery of data from non-volatile, auxiliary storage and more particularly to phase-locked loops used in data recovery channels for an auxiliary storage device. Still more particularly, the invention relates to a monolithically integrated, all digital phase-locked loop, operable at a nominal data rate for run length limited code recovered on a data recovery channel.

2. Description of the Related Art

Auxiliary storage is bulk memory for a computer that is of large capacity, slow, and inexpensive per unit of data stored. Auxiliary storage devices are usually based upon moving memory devices such as rotating magnetic or optical disks and drums, or upon moving magnetic tape, which may be locally physically altered in magnetic or optical properties to represent data. Locations for physically altered regions are aligned and spaced in tracks to ease location and readback of the data represented by the regions. Ideally, as a track is moved past a readback transducer at a fixed speed, the locations are presented at regular intervals and the physically altered regions are appropriately aligned and spaced to allow generation of equal and evenly spaced electrical pulses for formatting as data.

The conditions of data storage and recovery are rarely ideal and, as a result, data recovery channels must be adapted to overcome difficulties in, among other things, assigning value to each location, or bit cell, in a track on a magnetic media. A bit cell has 1 of 2 binary values, 1 or 0. If a transducer produces a qualified pulse, the bit cell the pulse is associated with must be determined. Shifts of frequency and of phase in the presentation of bit cells have adverse consequences for assigning the value associated to the correct bit cell. Recovery of a bit stream from a physical track requires recovery of the clock used to write the bit stream. The clock should correspond in frequency to the presentation rate for bit cell locations. Physically altered features of the tracks should be centered within the bit cell. However, a number of factors can cause the bit as written to the media to be shifted from its ideal position, resulting in frequency or phase shifts in readback signal generated by the readback transducer.

A magnetic or optical recording channel is designed to accept data for storage and deliver the same on retrieval demand at a later time with reasonable access delay and without errors. Self-clocking modulation codes are employed to ensure an adequate minimum rate of signal transitions for clock synchronization during data retrieval without exceeding the maximum transition storage density of the magnetic or optical medium during data storage. Such modulation codes are run-length-limiting (RLL) codes that represent a one-to-one mapping of binary data into a constrained binary sequence that is then recorded on the recording medium in the form of a modified Non-Return-to-Zero (NRZI) waveform.

In a NRZI waveform, the maximum and minimum number of spaces between consecutive transitions correspond to the maximum and minimum run lengths of zeros between two consecutive ones in the corresponding binary sequence, as is known in the art. Thus, such modulation codes fall within the class of RLL codes characterized by the parameters (d,k) where d represents the minimum and k represents the maximum number of zeros between two consecutive ones in the coded sequence. These codes are the result of a steady evolution of waveform design coupled with improvements in magnetic and optical recording channels, including improved clocking and signal-detection processes.

In a prior art recording channel, the read clocking function is the key to restoring digital data following transition detection. The read clocking function separates the synchronous data clock signal from the self-clocking data signal in the recording channel. It is usually performed by a phase-locked oscillator (PLO), which regenerates the synchronous data clock waveform in response to the flow of self-clocking signal waveform peaks from the magnetic or optical transition detector. Although this phase control loop can be primarily digital, as with a digital phase-locked loop (DPLL), some analog components have been necessary. Even in a DPLL, the digitally-controlled oscillator (DCO) has employed analog components. Ideally, a digital implementation without analog components is desired because it permits an inexpensive and efficient monolithic device to perform accurate read clocking without calibration drift or adjustment.

Phase-locked loops have been used for synchronizing a variable local oscillator with the phase of a received signal and as a consequence have been widely in a number of applications including bit and symbol synchronization. The basic elements of a phase-locked loop (PLL), particularly in a classic analog configuration, have long been well known. A phase-locked loop is a feedback circuit having a phase detector for comparing an exogenous input signal of potentially varying frequency and phase with a reference signal to produce a phase sensitive error signal. In most applications the phase sensitive signal is filtered by a loop filter designed to attenuate signal noise. The filtered phase sensitive signal is then applied to a voltage controlled oscillator (VCO) which in turn generates the reference signal to be fed back to the phase detector.

A phase-locked loop can generally maintain a lock on input signals over a frequency range called a "lock range". The process by which a phase-locked loop locks on input signals within the lock range is called capture. During capture, an analog phase-locked loop goes from a free-running condition to one in which the voltage controlled oscillator locks on to the frequency of the input signal. A number of complications are presented by capture, particularly of an input frequency which is quite close to the free running frequency, which are beyond the scope of this discussion.

In data recovery systems there has been a one-to-one relationship between the detected data and the associated clock. The analog read-back waveform has been processed, bits generated, and a phase-locked loop used to produce a serial data stream. The voltage controlled oscillator has been used to match the clock frequency with the frequency of data being recovered from the channel with 1 clock period being generated for every detected bit.

A number of digital phase-locked loops have been produced since the mid 1970's. Digital circuitry has a number of advantages over analog circuitry in terms of amenability to programming and suitability for monolithic integration. However, for data recovery systems, there are a number of disadvantages in a digital system which depends upon synchronization of the digital PLL local oscillator with the bit stream. First and foremost, voltage controlled oscillators are intrinsically analog devices. The VCO gain and operating points can be variable depending upon manufacturing processes utilized in their construction and can be relatively costly to build and qualify, thus nullifying what otherwise would be advantages of a digital system. Another disadvantage to digital PLLs that use an analog VCO is that any delays from the time the data is sampled to the time the PLL error voltage of the VCO is generated are within the PLL feedback control path. This vastly complicates design and forces tight engineering tolerances in input frequency for the data.

The superior response speed of analog circuitry has tended to exclude use of all digital phase-locked loops from use in data recovery channels for moveable memory. Preferred design in digital phase-locked loops has dictated a sampling rate of from 10 to 15 times, or more, of the bit stream rates for data channels in which the phase-locked loop in to be installed. Such sampling rates have been thought dictated by the need to avoid error resulting from aliasing phenomena resulting from analog to digital converters operating at a sampling frequency at an integer multiple of a frequency. With proposals for data channels having bit stream rates of up to 80 Mbits/sec., sufficiently high sampling rates are not feasible in contemporary semiconductors. Even were sufficiently high operating frequencies obtainable, inordinate amounts of power would be consumed. Even at bit stream rates of 10 MHz, fabricating an all digital phase-locked loop is, with prior art technology a difficult objective.

SUMMARY OF THE INVENTION

It is one object of the invention to provide an all digital phase-locked loop for use in data from nonvolatile, auxiliary storage units.

It is another object of the invention to provide a phase-locked loop suitable for monolithic integration for use in a data recovery channel.

It is still another object of the invention to provide a phase-locked loop for use in data decoding which can be run at a sampling rate close to the nominal data rate of the data being recovered.

In accordance with one embodiment of the present invention, a system and method for estimating input phase for bit cells recovered from run length limited code where the bits cells have a nominal duration upon recovery allows use of sampling rate as low as the nominal data rate in an all digital phase-locked loop is provided. For the all digital phase-locked loop, a clock generates sample cells of a fixed duration. The sample cell phase contribution corresponding to a proportion of the nominal duration to the fixed duration is calculated and added to an accumulated phase value with each successive sample cell. For each sample cell, an input phase estimate is made from the accumulated phase value and timing information for any bit cell event occurring within the sample cell. Finally the input phase estimate information is used to adjust an accumulated phase value for the next sample cell.

BRIEF DESCRIPTION OF THE DRAWINGS

The foreground aspects and other features of the present invention are explained in the following written description, taken in connection with the accompanying drawings, wherein:

FIGS. 15–20 are phase maps and programming for the data recovery unit of FIG. 14.

DETAILED DESCRIPTION OF THE INVENTION

The following detailed description is of the best presently contemplated mode for carrying out the invention. This description is not to be taken in a limiting sense but is made merely for the purpose of illustrating the general principles of the invention since the scope of the invention is best defined by the appending claims.

Figure 1:
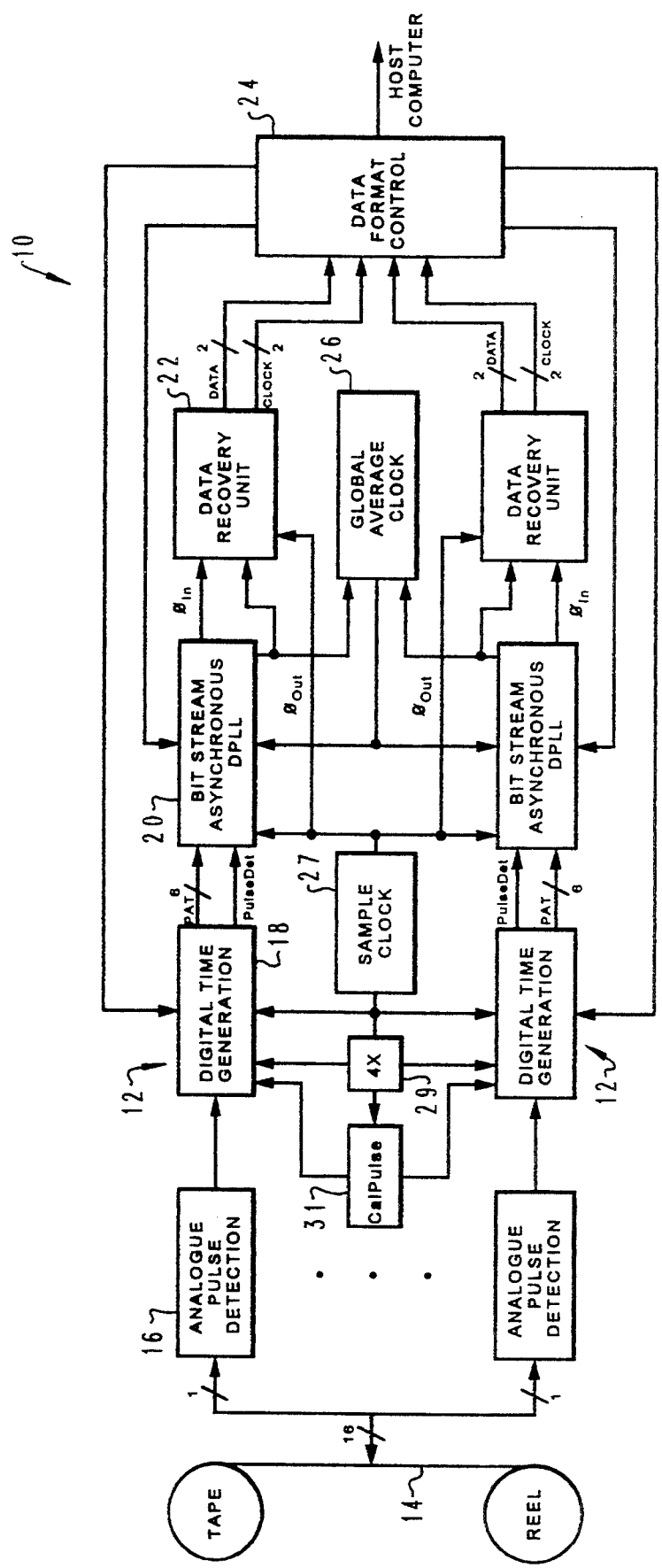
FIG. 1 is a high level block diagram of a plurality of parallel bit stream data recovery channels incorporating the inventive phase-locked loop.

FIG. 1 is a block diagram illustrating a data recovery unit 10 comprising a plurality of parallel data recovery channels 12. Each channel 12 is dedicated to one of a plurality of tracks on a data storage system 14 of the moving magnetic tape type. Although the invention is illustrated with a tape system, those skilled in the art will now realize that the invention can be employed with other types of moving storage systems. Analog pulse detection circuitry 16 includes a transducer, buffering and amplification circuitry well known in the art for recovery of a raw data signal. The raw data signal from analog pulse detection circuitry 16 is applied to a digital time generation circuit 18. Digital time generation circuitry utilizes a fixed clock or sample period for generating a pulse acquisition timing signal (PAT) and a PULSEDET signal indicating detection of a valid pulse. Both the PAT and PULSEDET signals are applied to a bit stream asynchronous phase-locked loop 20. Bit stream asynchronous phase lock loop 20 produces an input phase estimate signal ($\phi_{in}$) which is applied to a data recovery unit 22 and an accumulated output phase signal ($\phi_{out}$) which is applied to data recovery unit 22 and a global average frequency generator 26. Data recovery unit 22 generates a data stream and a clock which are applied to data format control 24 for recovery of data bytes usable by a host computer system (not shown). Global average frequency generator 26 returns a clock signal to bit stream asynchronous phase lock loop 20, the use of which is described below. Digital time generation circuitry 18 and bit stream asynchronous phase-locked loop 20 are clocked by a fixed sample clock generating circuit 27. For some components within digital time generation circuit 18, the sample clock is multiplied by a factor of four by frequency multiplier 29. The output of frequency multiplier is also used to generate calibration pulses (CALPULSE).

Bit stream asynchronous phase-locked loop 20 can, for RLL encoding with (d,k) formats with $d \geq 0$, recover a bit stream without matching a local frequency generator to the frequency of the raw data stream. Asynchronous phase-locked loop 20 operates as a type II, third order phase-locked loop during tracking mode operation. A type II PLL can track a frequency error to 0 steady state phase error and a phase acceleration to a constant steady state phase error.

Figure 2:
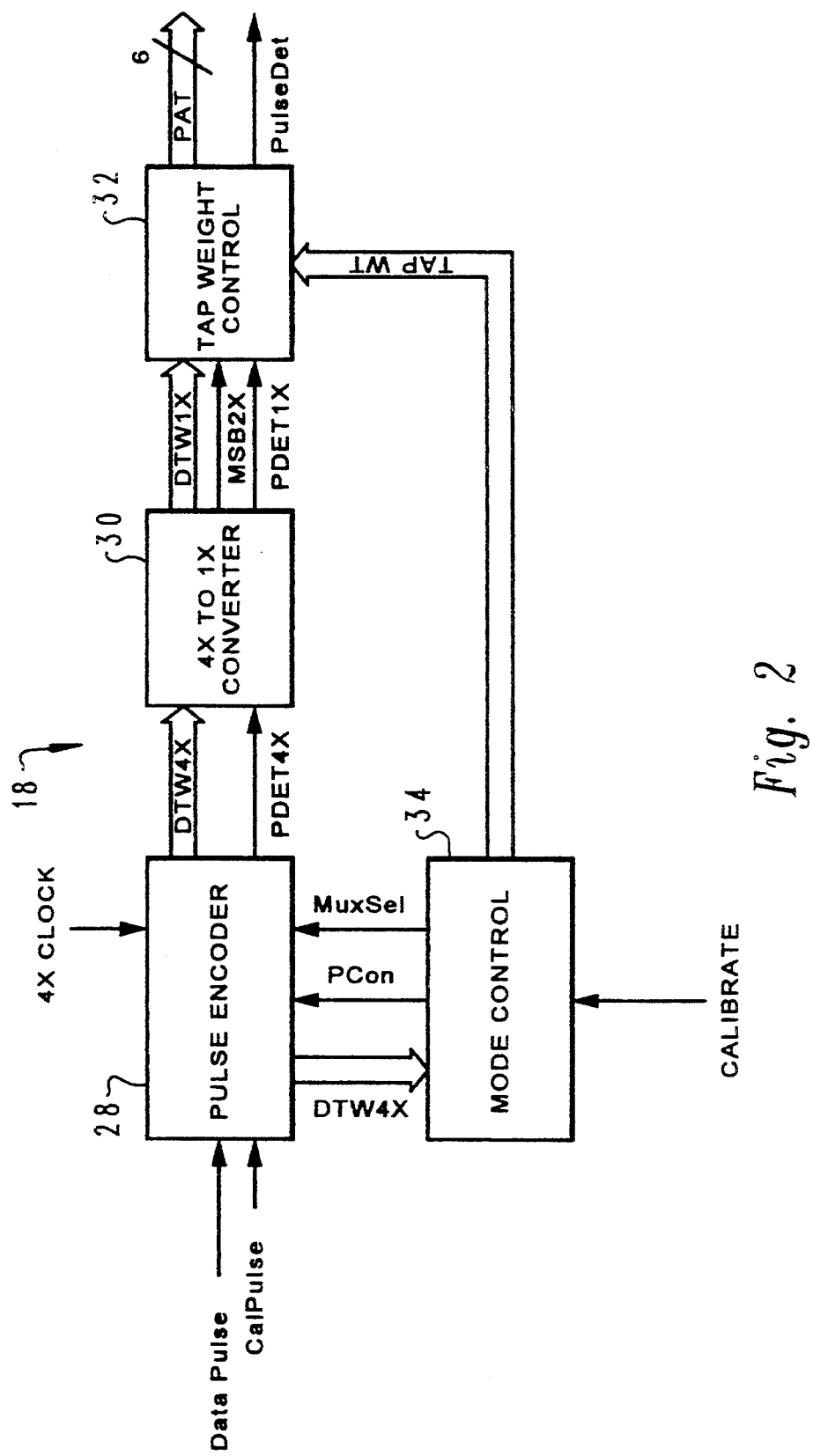
FIG. 2 is a high level block diagram of a digital time generator.

Utilization of bit stream asynchronous digital phase-locked loop 20 with analog pulse detection circuitry 16 requires use of an interface to produce pulse position information and valid pulse detection. A digital time generator as shown in the block diagram of FIG. 2 provides one such interface. Digital time generator 18 includes a pulse encoder 28 which receives a data pulse signal as an analog input, a clock signal running at four times the sample clock, a multiplex select signal, a calibration pulse signal (CALPULSE) and a pulse confirmation signal (PCON) from mode control 34. Pulse encoder 28 preferably operates at a fixed sample rate that is four times the sample clock for the channel. Pulse encoder 28 produces two output signals DTW4X and PDET4X. DTW4X is a binary encoded number representing the absolute position of a data pulse in a tap delay line. PDET4X is a valid pulse control output. The manner of generation of these signals is explained in greater detail below with reference to FIG. 3. The signals DTW4X and PDET4X are applied to a 4X to 1X converter 30 from pulse encoder 28 and divided by 4 to reduce the output frequency to the sample clock. When a data pulse is detected, the 4X to 1X converter selects the valid pulse encoder output from a set of 4 samples. It also controls the pulse detected signal PDET1X and determines the appropriate logic level for the most significant 2 bits (MSB2X). Output signals DTW1X, MSB2X and PEDET1X from converter 30 are also applied to tap weight control 32.

Digital time generator 18 requires a calibration mode in order to compensate for the variable propagation delays in the tap delay line and thereby relate absolute position in the delay line to relative position in a sample cell. The variability in the propagation delay times for each tap can vary by factors of up to 3 to 1. In calibrate mode, the location of a calibration pulse in delay line is measured and from this, the size of each tap relative to the sample clock is determined. Once the tap weights are known, they can be applied to the tap weight control 32 to be multiplied with the pulse encoder output to give relative position of a data pulse within a sample period. Tap weight control 32 also normalizes the output of the 4X to 1X converter relative to the actual size of the sample cell. PAT is a binary number that represents the relative position of the data pulse in the sample cell. This binary number, along with the valid pulse detected signal (PulsePet), are passed to the bit stream asynchronous digital phase lock loop 20 for further processing.

Figure 3:
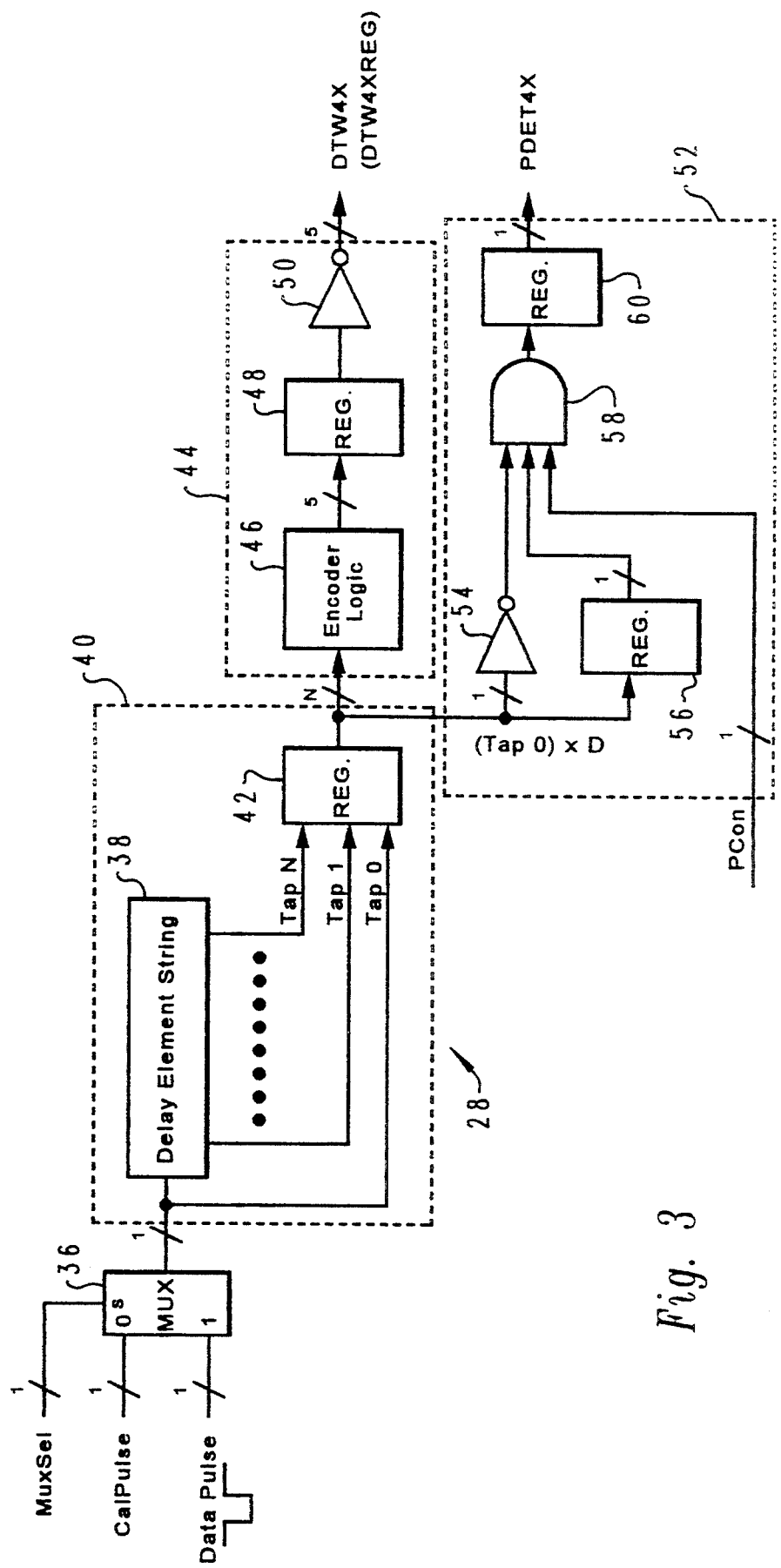
FIG. 3 is a detailed block diagram of a pulse encoder for the digital time generator of FIG. 2.

FIG. 3 is a detailed block diagram of pulse encoding circuit 28. A multiplexor 36 allows selection between a calibration pulse or an analog data pulse based on the input value of the MuxSelect signal from mode control circuit 34. Connection circuits for clock enable signals to the various multiplexors and registers of pulse encoding circuit 28 has been deleted for sake of simplicity. Upon receipt of a calibration pulse or valid data pulse, delay element string 38 will gradually fill with string of ones which displace 0's left by the waveform of the RLL code. Upon completion of a 4X sample cell, the value at each delay element tap is read into a different cell of register 42. Typically delay element string 38 and register 42 have capacity to handle 32 taps. An encoder map circuit 44 includes encoder logic 46 for generating a 5 bit binary number identifying a location for an edge transition beginning a string of ones in delay element string 38. This number is output from encoder logic 46 to a register 48 and then placed onto a 5 bit output bus through inverting buffer 50.

The contents of register 42 are also analyzed to determine if a valid pulse has been detected. A constraint on a data pulse is that it must be longer in duration than a 4X sample cell. A valid pulse will have a value of 0 at tap 0 during a 4X sample cell which includes the leading edge of the pulse. In all (d,k) data formats, a 0 is always followed by a 1. During a subsequent sample cell, the value in tap 0 should return to 1. Inverting buffer 54 and 1 bit register 56 are used to compare the values of the zero tap for each set of adjacent sample cells. The outputs of inverting buffer 54 and register 56 will both be 1 only where a sample period has had a tap 0 value of 1 followed by a tap 0 value of 0 for the next subsequent period. Thus every pulse results in generation of a valid pulse detect signal eventually. The PCON signal input to AND-gate 58 operates as an enable allowing AND-gate 58 to pass detection of a valid pulse. PCON is high if digital time generator 18 is not in calibration mode. Register 60 latches the output of AND-gate 58.

Figure 4:
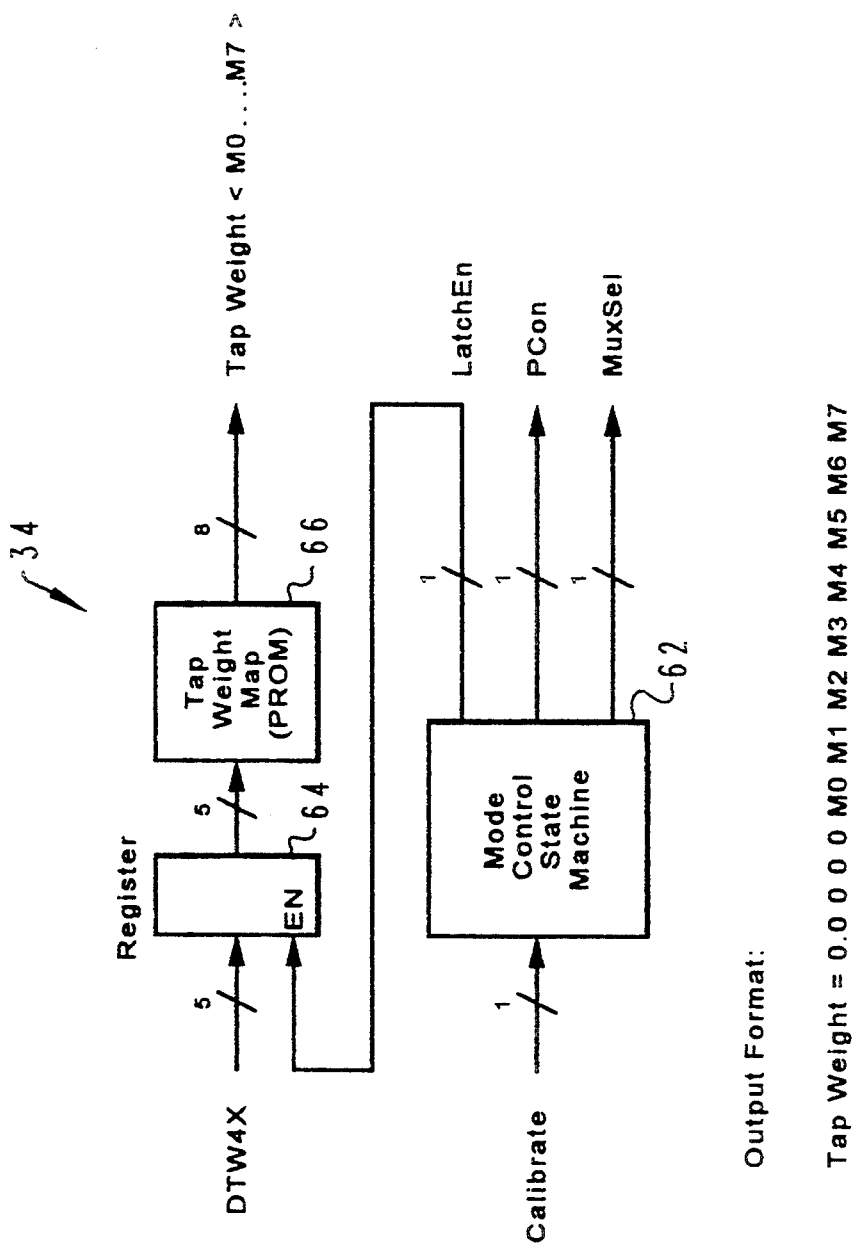
FIG. 4 is a detailed block diagram of a digital time generator mode control state machine.
Figure 5:
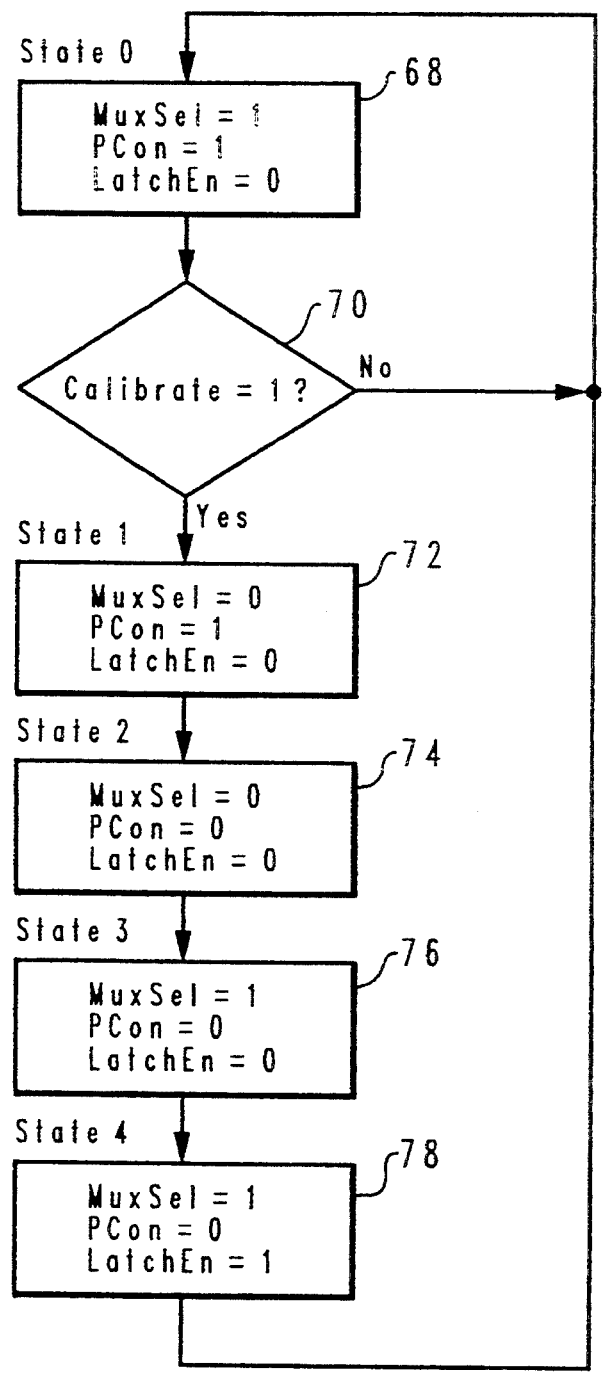
FIG. 5 is a logical flow chart for the state machine of FIG. 4.

FIG. 4 is a block diagram of mode control circuit 34. A mode control state machine 62 receives a calibrate signal from a data storage subsystem controller or data format control 24. Mode control state machine 62 controls the values of 3 output signals: latch enable (LATCHEN); PCON; and MuxSelect (MUXSEL). The values taken by these signals are depicted in the flowchart of FIG. 5 which describes the state machine. The latch enable output is applied to a register 64 which receives the DTW4X signal from pulse encoder 28. This signal is used to map into a tap weight map 66 which is preprogrammed in programmable read only memory or look-up table. Tap weights are applied to a tap weight control circuit 32.

FIG. 5 is a logical flowchart of mode control state machine 62. State machine 62 operates as an endless loop normally held in state 0 corresponding to step 68 by the calibration signal being equal to zero. This condition is periodically tested in decision step 70. In state 0 the MuxSelect and PCON signals equal 1 and the latch enable equals 0 which implies the address provided by register 64 into the tap weight map prom 66 is locked. Once the calibration signal equals 1, the YES branch of step 70 is followed to step 72, which places the machine in state 1. In state 1 MuxSelect goes to 0 which results in a calibration pulse derived from the fix clock being multiplexed into the pulse encoding circuitry. With the next 4X sample cell state 2, reflected by step 74, is entered. At this point in time the value of PCON goes to 0, which disenables value pulse control circuitry 52. Next, step 76, reflecting state 3, is entered. MuxSelect now goes to 1 which implies the CALPULSE state during two sample cells has been passed to delay line 38. Next, step 78 is executed. Latch enable assumes a value of 1 allowing the address into the tap weight map 66 to be rewritten. The state machine now returns to state 0.

Figure 6:
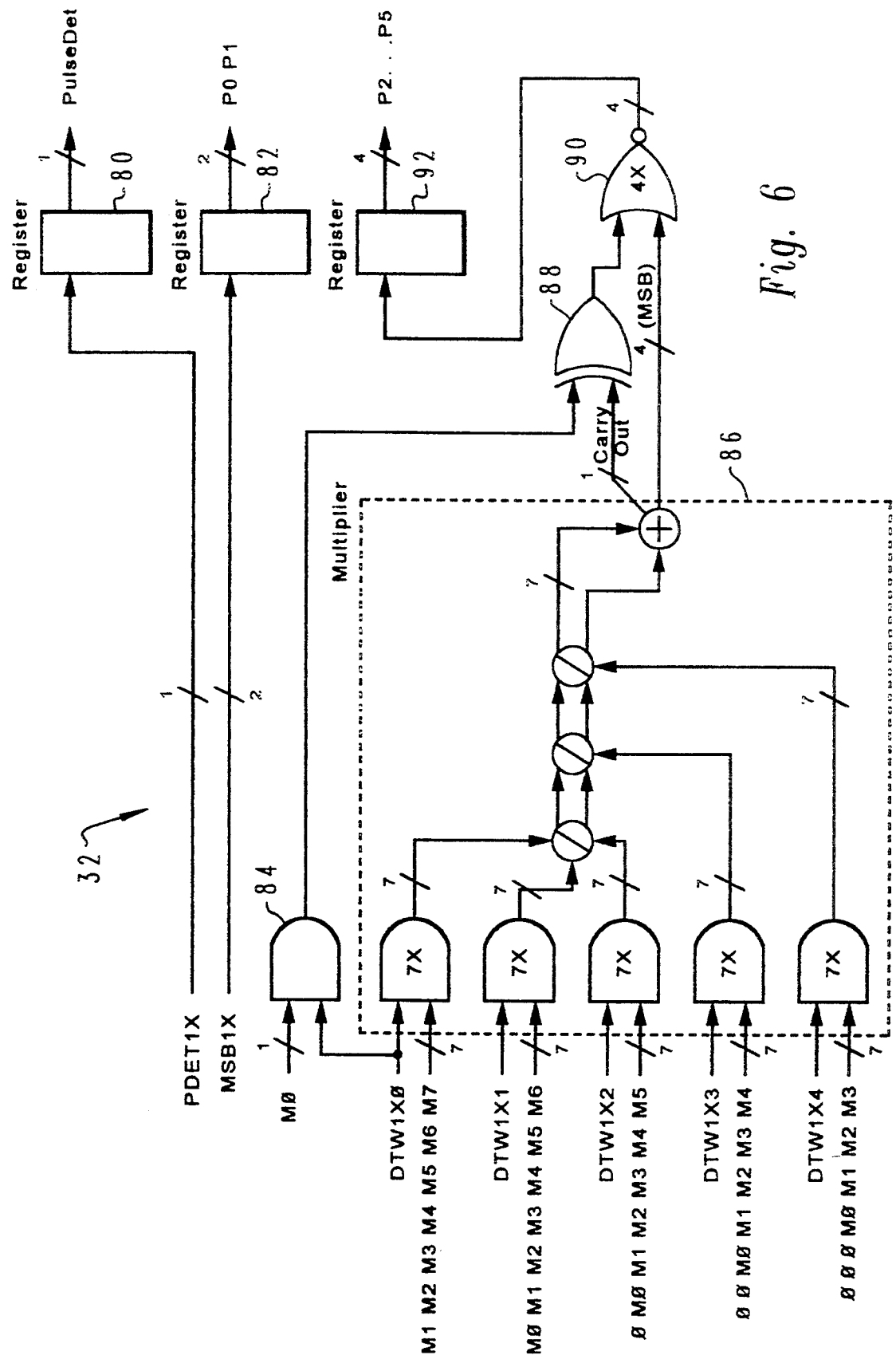
FIG. 6 is a detailed block diagram of a tap weight controller for the digital time generator of FIG. 2.

FIG. 6 is a block diagram of the tap weight control circuit 32. Assorted tap weights are identified as M0 through M7. Tap weight control circuit 32 provides for latching of the valid pulse detection signal 1X in register 80 for application to stream bit asynchronous digital phased lock loop 20. The MSB1X signal carrying the 2 most significant bits of a pulse position are latched in register 82 to provide the P0 and P1 components of the PAT signal to the phase lock loop. AND-gate 84 and multiplier 86 provide for multiplication of the DTW1X signal by tap weights M0 through M7. AND-gate 84 provides 1 bit out and multiplier 86 provides 4 most significant bits and a carry out. The output of AND-gate 84 and the carry out for multiplier 86 provide inputs to an exclusive OR-gate 88. Within multiplier 86 the DTW1X signal components operate as enables to five arrays of 37 AND-gates. The tap weight outputs passed by the AND-gates are summed and the least significant bits truncated to provide the 4 most significant bits and a carry out. The output of exclusive OR-gate 88 and the 4 most significant bits from multiplier 86 provide inputs to a NOR-gate array 90 of 4 NOR-gates. An overflow thus results in the output from NOR-gate array 90 being set to the maximum output. The outputs of NOR-gates 90 is latched by register 92 to provide the P2 through P5 components of the PAT signal. The PAT signal comprising components P0 through P5 and the pulse detect signal PULSEDET are applied to phase-locked loop 20 which is now described in detail.

Figure 7:
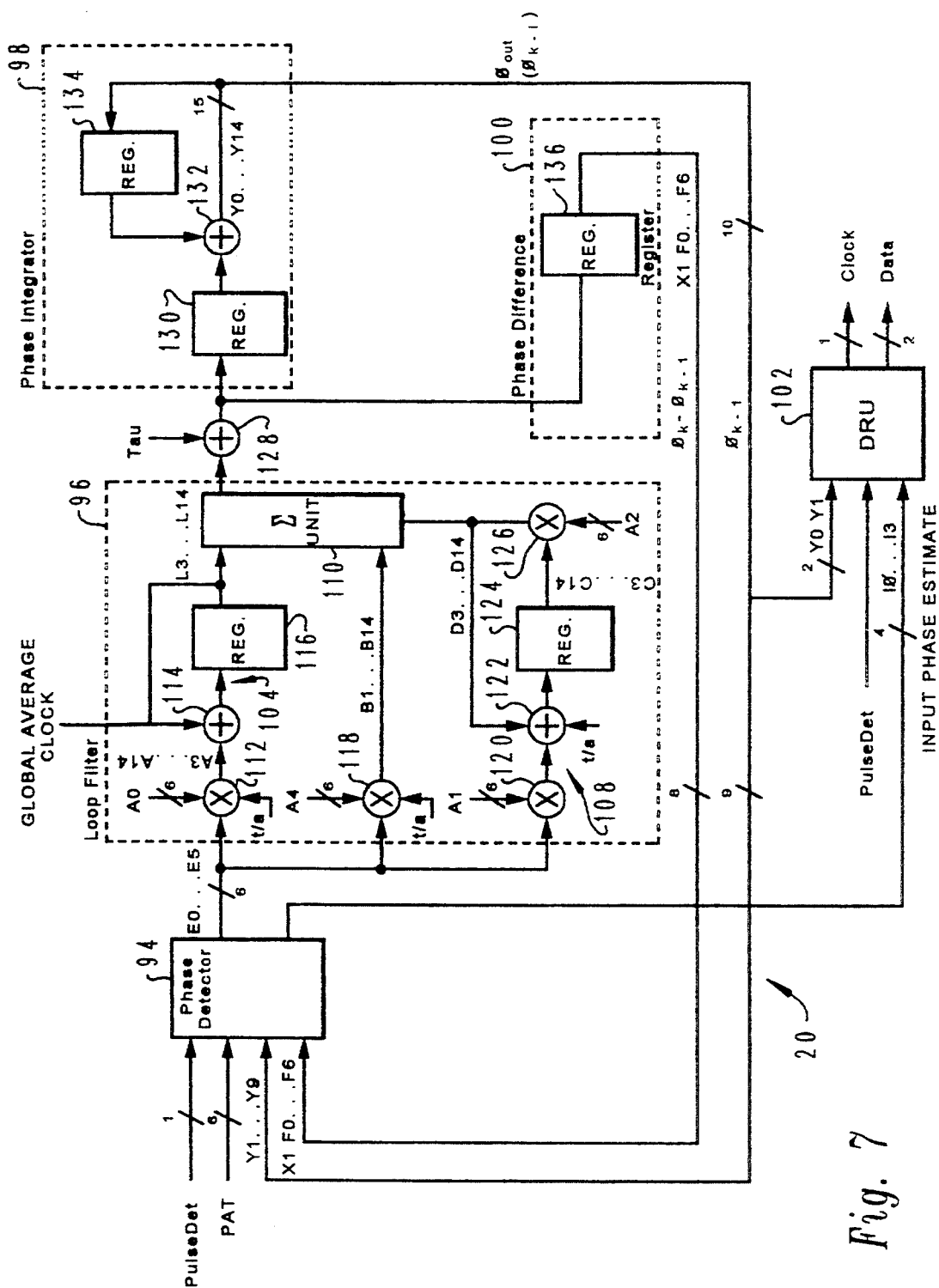
FIG. 7 is a block diagram of a bit stream rate asynchronous phase-locked loop in accordance with the invention.

FIG. 7 is a block diagram of bit stream asynchronous digital phase lock loop 20. Loop 20 is a feedback control loop with 3 main sections: a phase detector 94; a low pass loop filter 96; and a phase integrator 98. Phase detector 94 may be simplified by providing phase difference circuit 100. A data recovery unit 102 utilizes the 2 most significant bit Y0 and Y1 of an accumulated output phase signal $\phi_{out}$ (also $\phi_{k-1}$) and an input phase estimate signal $\phi_{in}$ from the phase detector to recover data and a clock for the data. The clock output of data recovery unit 102 should not be confused with the frequency of the sample cells which phase lock loop 20 uses.

Designs based on phase lock loop 20 can tolerate variations in the data rate from nominal of plus or minus 7%. Where an acquisition mode of operation is provided, the range is enlarged to plus or minus 15% or more. Nominally, the sample cell duration for phase lock loop 20 matches nominal bit cell duration. Thus when the actual data frequency varies from nominal a sample cell comprises shifting portions of contiguous bit cells. Because bit cells may be shorter in duration than a sample cell, a sample cell may, under extreme circumstances, extend to three bit cells. Likewise, a bit cell may be longer in duration than a sample cell and thus a sample cell may not include all of even a single bit cell. Thus data recovery unit 102 must provide for recovery of the actual data clock. This lack of synchronization of the sample clock to the data clock and the fact that a sample clock can extend to portions of up to 3 data clock bit cells, or to less than all of a data clock bit cell, relates to why the system phase lock loop 20 is best utilized with (d,k) modulation codes. In such modulation codes each 1 bit is spaced from another 1 bit by at least one bit cell having value 0. No more than k 0's in sequence can occur.

The phase-locked loop 20 tracks the input phase and generates a sequence of numbers representing the output phase, an approximation to the input phase. If any two samples of the output phase are known, then the input phase estimate of the rising edge of the bit cells can be determined by making a first-order approximation (straight line) between output phase samples and solving for the points in time where the output phase modulo $2\pi = 0$. Thus, the data pattern can be completely reconstructed if the output phase and the input phase estimate of the detected event are known.

An interesting feature of this data recovery technique is that, depending on the modulation code, the phase-locked loop 20 can receive data at a bit rate higher than the phase-locked loop 20 sample rate and yet the data can be fully restored. If the maximum bit rate occurs at $f_{max}$, then the theoretical minimum sample rate at which the phase-locked loop 20 must operate is $f_{max}/2$ for a (1,k) modulation code. For a (2,k) modulation code, the theoretical minimum sample rate is $f_{max}/3$. The minimum sample rate is discussed in the following section on the phase detector.

By definition, a phase-locked loop is a control loop that "locks" to the input phase. In reality, in a digital system there is no input phase on which to lock. A phase error must be derived from the detected event. It is the function of the phase detector to generate a phase error based upon the arrival time of the detected event and the current output phase. This process is described below.

Phase detector 94 generates a phase error $\phi_e$ (E0 through E5) and an input phase estimate $\phi_{in}$ (10 through 13) based upon the current phase adjustment signal $(\phi_k - \phi_{k-1})$ from phase difference unit 100, an accumulated output phase signal $\phi_{out}$ or $\phi_{k-1}$ from phase integrator 98, and an estimate of the pulse acquisition time $t_{pat}$ (PAT) from a digital detector. It is assumed that, at the arrival time of the detected event, the input phase modulo $2\pi = 0$. Thus, the phase error at the arrival time of the detected event is simply the value of the output phase at this time. The first step in generating a phase error is for the system to map the arrival time of the detected event into a number that reflects the relative location of the detected event between sample cells. For example, if the detected event occurred half-way between sample times, then the input into the phase detector would be $\frac{1}{2}$. The phase error signal and input phase signal are input phase estimate are generated using a first order approximation:

$$-\phi_e = \phi_{in} = (\phi_k - \phi_{k-1}) \times t_{pat} + \phi_{k-1} \quad (1)$$

where $\phi_k$ and $\phi_{k-1}$ are the output phase spaced by one sample cell.

With this method of determining phase error, the maximum number of detected events that can arrive at every sample is 1. Thus, for a (1,k) modulation code, there must be at least one sample for every 2 bit cells. For a (2,k) modulation code, there must be at least one sample for every 3 bit cells. Theoretically this means that, depending upon the modulation code, the ADPLL can operate at a sampling rate that is much lower than the nominal bit rate.

In a normal tracking mode, the phase error is truncated to plus or minus 50% of the bit cell. However, in the acquisition mode of a system with a (d,k) modulation code, the phase error can be truncated to plus or minus 100% of the bit cell. When combined with increased loop filter gain, this allows phase lock loop 20 in an acquisition mode to lock onto signals that deviate more than plus or minus 15% from the nominal center frequency.

Loop filter 96 is a second order digital filter. The loop filter provides stability to the loop and attenuates noise on the phase-error estimate. For the ADPLL, the loop filter is all digital and sampled at the same rate as the rest of the loop. There are many possible designs for the loop filter, with the useful designs being some form of a low-pass filter. When combined with phase integrator 98, phase lock loop 20 is a third order type II control feedback loop. Phase lock loop 20 can track a frequency error to a 0 steady state phase error and a phase acceleration to a constant steady state phase error. The transfer function for loop filter 96 in z domain is:

$$D(z) = \frac{\phi_{adj}(z)}{\phi_e(z)} \quad (2)$$

and $$\frac{\phi_{adj}(z)}{\phi_e(z)} = \frac{(A0 + A + 1 + A3)z^2 - (A1 + A0A2 + A3(1 + A2))z + A2A3}{(z - 1)(z - A2)} \quad (3)$$

where $\phi_{adj}(Z)$ is the phase adjustment at the output of the loop filter and A3 equals A4 minus A0. When the A1 coefficient to the loop filter is set to 0 the loop filter becomes a first order filter and the phase lock loop 20 becomes a second order type 2 control feedback loop. Such a configuration is used during signal acquisition with a transfer function for first order loop filter being:

$$D(z) = \frac{\phi_{adj}(z)}{\phi_e(z)} = \frac{(A0 + A3)z - A3}{(z - 1)} \quad (4)$$

Phase integrator 98 replaces the function of a voltage controlled oscillator in an analog phase-locked loop. With every sample period, phase integrator 98 takes the accumulated output phase signal stored in register 134 and adds that value to a phase adjustment signal including the output from loop filter 96 and a tau value (sample cell size divided by nominal bit cell size). In order to keep the accumulated output phase from overflowing register 134, two adjustments are made. First, output phase is normalized to channel bits (1 channel bit equals $2\pi$ radians) and second, the previous output phase is truncated with each sample cell. In the tracking mode, only the fractional portion of the previous output phase is added with each sample. The maximum size of the previous truncated output phase is less than 1 and the size of the sample cell is 1 for a system that samples at the nominal bit rate. The phase adjustment from loop filter 96 is rarely larger than 0.5 as normalized, (depending upon the loop filter gains). Thus, the maximum phase output value is 2.5 with each sample cell. Loop filter 96 comprises 3 parallel stages including a frequency integrating channel 104, a phase shift impulse channel 106 and a phase error time decay channel 108.

Frequency integrating channel 104 includes a gain control stage 112 which applies a gain of A0 to the phase error signal. The output of the gain stage is fed to a summer 114 which sums the gain adjusted signal with accumulated gain adjusted phase errors stored in register 116. Channel 104 provides a constant adjustment if phase error goes to 0. The accumulated values in register 116 are also applied to a summing unit 110.

Impulse channel 106 provides a gain stage 118 for modifying any phase error occurring in a current period and applying that adjusted signal to summing unit 110. Gain stage 118 will have a null output value whenever phase error is 0.

Time decay channel 108 comprises a gain multiplying stage 120 in series with a summing unit 122. The output of summer 122 is applied to a latch register 124. With each sample period the current value in latch register 124 is applied to a gain stage 126 and the output to the gain stage 126 is returned to summer 122 for summation with the output of the gain stage 120. The output from gain stage 126 is also fed to summing unit 110. A phase errors applied to channel 108 will decay with successive sample cells with the effect that the channel operates to smooth responses to phase transitions.

Summer 128 is connected to receive the output of summing unit 110 and to add thereto the tau factor previously described. The resulting modified phase adjustment signal is latched by register 130 in phase integrator 98 and register 136 in phase difference circuit 100. The output of register 136 is returned to phase detector 94 as a feedback signal. Within phase integrator 98 the value latched in register 130 is applied to a summer 132 for accumulation with retained values in register 134. As described above this value is truncated with each sample cell to avoid overflow of register 134. With each sample period the current output from 132 is returned to phase detector 94 as a feedback signal.

Figure 8:
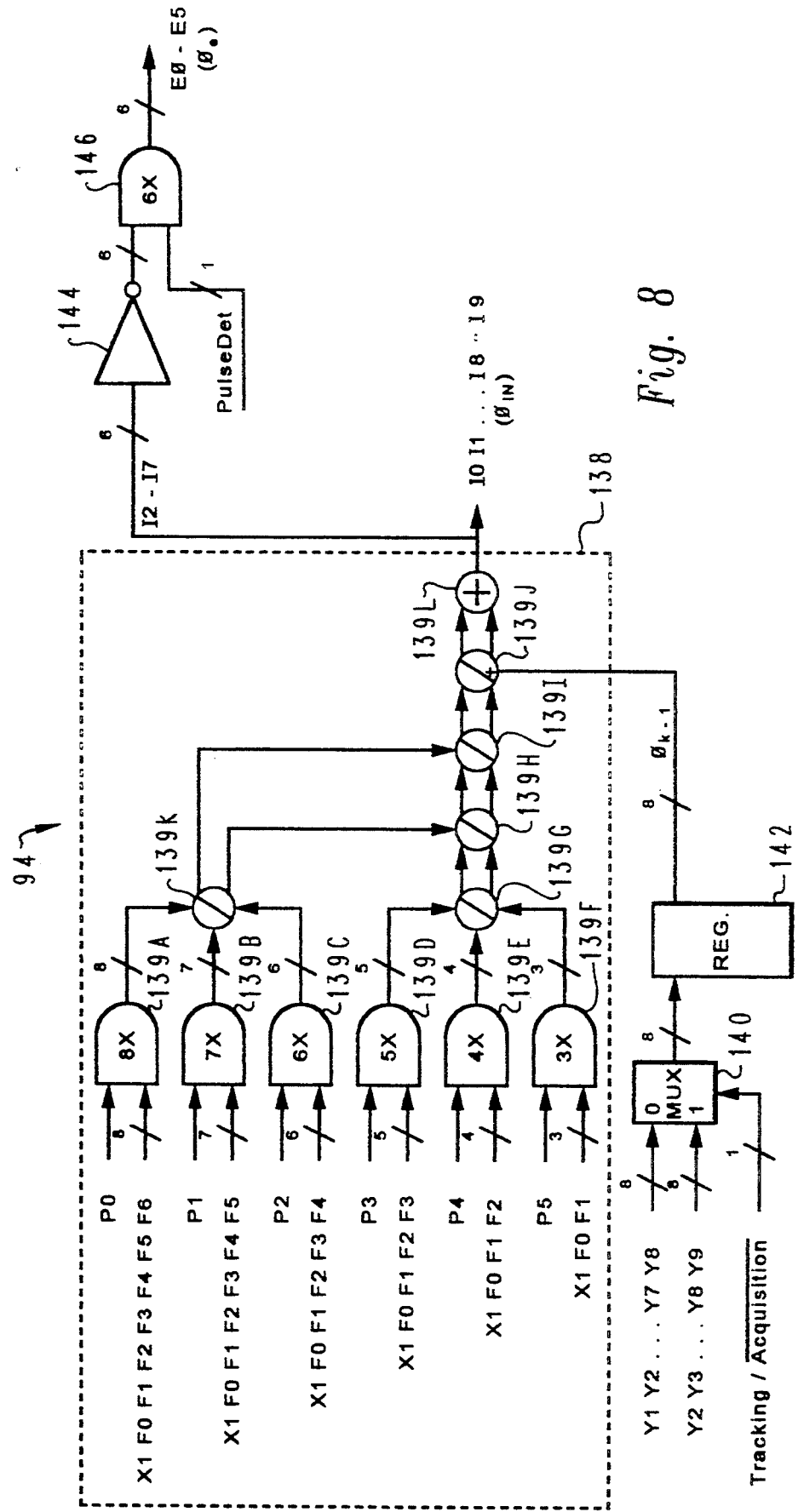
FIG. 8 is a detailed block diagram of a phase detector for the phase-locked loop of FIG. 7.

FIG. 8 is a block diagram of phase detector 94 illustrating appropriate logic circuits for implementation of Equation 1. Block 138 is a hardware implementation of that portion of the equation for generating $(\phi_k - \phi_{k-1}) \times t_{pat}$. Those skilled in the art will recognize that this specific embodiment is one of many ways of achieving the result. Implementation is provided by an array of AND-gates 139a through 139f which utilize the components of the PAT signal to gate the components of the current output phase signal X1, F0 through F6. The results from groups of AND-gates arrays are summed in full binary summers 139g and 139k. The results from summers 139g and 139k are combined in binary summers 139h and 139i. Binary summer 139j combines these results with the value in register 142 which is $\phi_{k-1}$. Binary look ahead adder 139k combines the outputs of summer 139j into the input phase estimate.

Multiplexor 140 and register 142 provide for switching between tracking and acquisition modes. In acquisition mode the Y1-Y8 components of $\phi_{k-1}$ are selected, in effect a multiplication of the feedback value from phase integrator 98 by 2. Multiplexor 140 selects Y2-Y9 in response to selection of tracking mode. Register 142 latches the output from multiplexor 140 for application to summer 139j.

The phase error signal is the inverse of the estimate phase input. Inverter 144 operates on the output of carry look ahead adder 139k to generator the phase error signal. A phase error signal is provided only where a valid pulse detect occurs. Pulse detect signal is used to control gating of the phase error signal components through AND-gate array 146. The phase error signal $\phi_e$ can assume a nonzero value only in the presence of a valid pulse detect signal.

Figure 9:
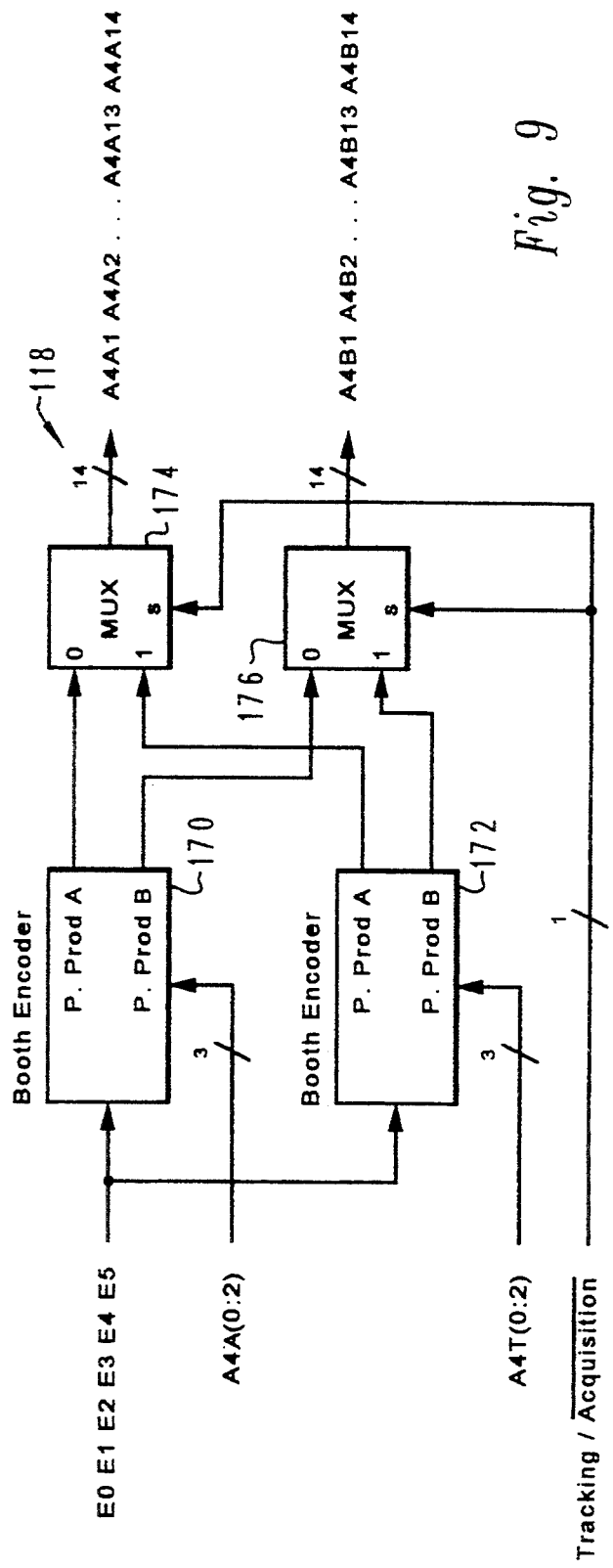
FIG. 9 is a block diagram of a gain element for use in a loop filter for the phase-locked loop of FIG. 7.

FIG. 9 is a block diagram of gain multiplier 118. Except for the programmed gain, it is identical to gain multiplier 112. The phase error signal is applied to parallel Booth encoders 170 and 172. Acquisition gains A4A are applied to booth encoder 170 and tracking gains A4T are applied to booth encoder 172. The parallel outputs of booth encoder 170 are applied respectively to the 0 inputs of multiplexors 174 and 176 while the parallel outputs of booth encoder 172 are applied to the 1 inputs of multiplexor 174 and 176. The tracking acquisition signal line is received by both multiplexors on their respective select inputs to select for transmission the values being received on the 0 input (for acquisition) or the 1 input (for tracking). As discussed below these 2 outputs are summed in the summing unit 110, although for conceptual purposes they may be regarded as summed at this point to provide the B1 through B14 output signal of filter 106.

Figure 10:
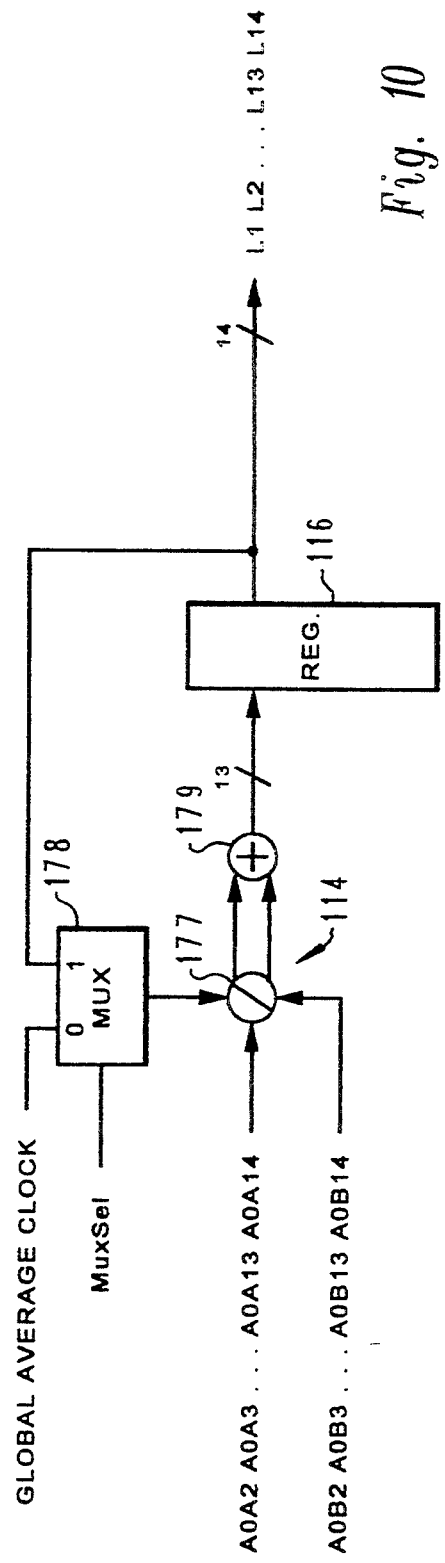
FIG. 10 is a block diagram for a frequency integrating channel for use in a loop filter for the phase-locked loop of FIG. 7.

FIG. 10 is a block diagram illustrating a frequency integrating filter 104, which follows gain multiplier 112. The outputs of a gain stage identical to that of FIG. 10 are provided to a binary full adder 177. Also applied to binary full adder 177 is the value stored in register 116, or from global average frequency 26, as selected by a multiplexor selection signal applied to multiplexor 178. In the latter case, the value stored in register 116 from sample cell to sample cell is the global average frequency plus the most recent phase error. The value stored in register 116 accumulates from sample to sample. In case of 0 phase error the value in register 116 remains unchanged unless the global average frequency is used and changes. It may also be seen that because register 116 can have a nonzero output where there is 0 phase error, phase look loop 20 can be phase-locked to an incoming pulse position signal PAT without the synchronization of the local sample clock for phase lock loop 20. Register 116 with the tau factor supplies a constant phase adjustment for each sample period required to maintain the phase lock. In some embodiments, the tau factor of stage 128 is added to the phase adjustment signal following register 116.

Figure 11A:
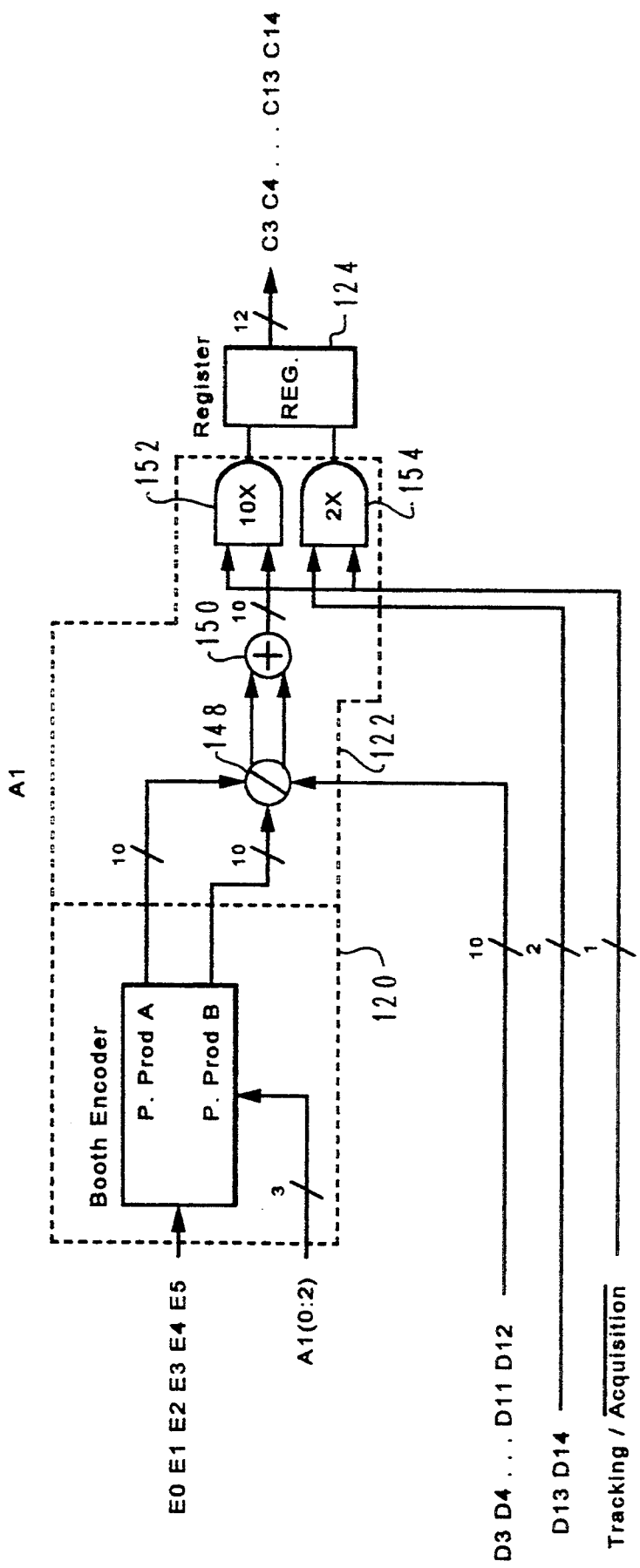
FIGS. 11A and 11B are detailed block diagrams of a phase error time decay channel for a loop filter used with the phase-locked loop of FIG. 7.
Figure 11B:
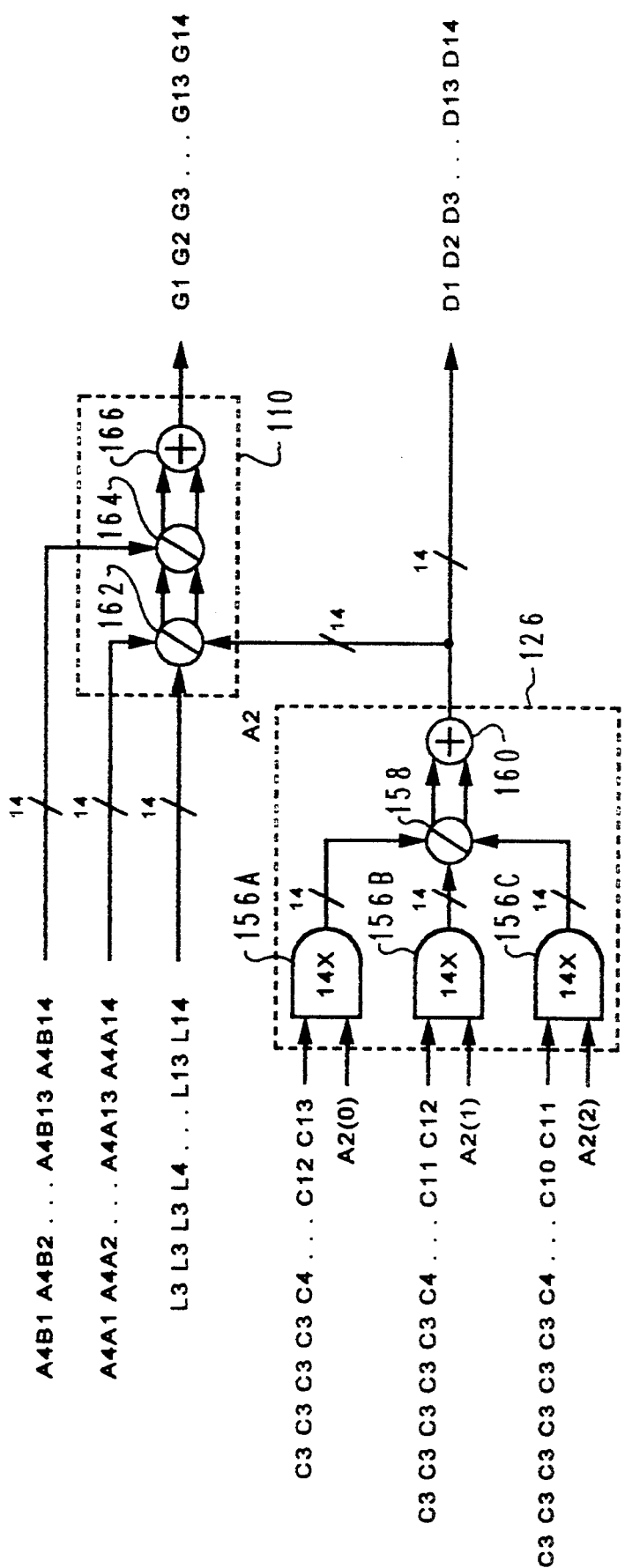

FIGS. 11a and 11b depict a block diagram of a time-decay filter 108. Filter 108 operates only during tracking mode. Gain stage 120, provides multiplication of the phase error signal and gain A1 by a Booth encoder which takes the phase error signal and the gain weights as its inputs and provides a parallel products A and B as outputs to summing stage 122. Summing stage 122 include a full binary adder 148 for receiving the outputs of the Booth encoder and a time decay feedback signal D3 ... D12. The result from summer 148 is then combined by carry look ahead adder 150. The output of adder 150 is applied bitwise to a 10×2 AND-gate array 152. Each of the 10×2 AND-gates in array 152 is gated by the tracking mode signal when high, which occurs during tracking mode. AND-gate array 152 passes the output of summer 150 to register 124 during tracking, but during acquisition passes 0 to register 124. The D13 and D14 bit components of the time decay feedback signal are passed unmodified to register 124 during tracking by 2×2 AND-gate array 154. Register 124 latches the output of gate arrays 152 and 154 (C3 through C14) for application to gain stage 126. In case of zero phase error, the value in register 124 decays to zero over time.

Gain stage 126 multiplies the C3 ... C14 values with gain A2. Arrays 156a through 156c of AND-gates use the A2 gain components as enable signals for gating C3 through C14. The outputs from the AND-gate arrays 156a through 156c are summed by a binary full adder 158 the results of which are output to a carry look ahead adder 160 to generate time decay feedback output D1 through D14. The time-decay feedback signal is applied to summing unit 110 for generation of the phase adjustment signal.

Summing unit 110 comprises a binary full adder 162 which adds the outputs from filter 108, filter 104 and a portion of the signal provided by filter 106. A second binary full adder 164 takes the output of binary full adder 162 and adds it to a second component from filter 106. The output of adder 164 is then applied to a carry look ahead adder 166 to generate a phase adjustment signal G1 through G14.

Figure 12:
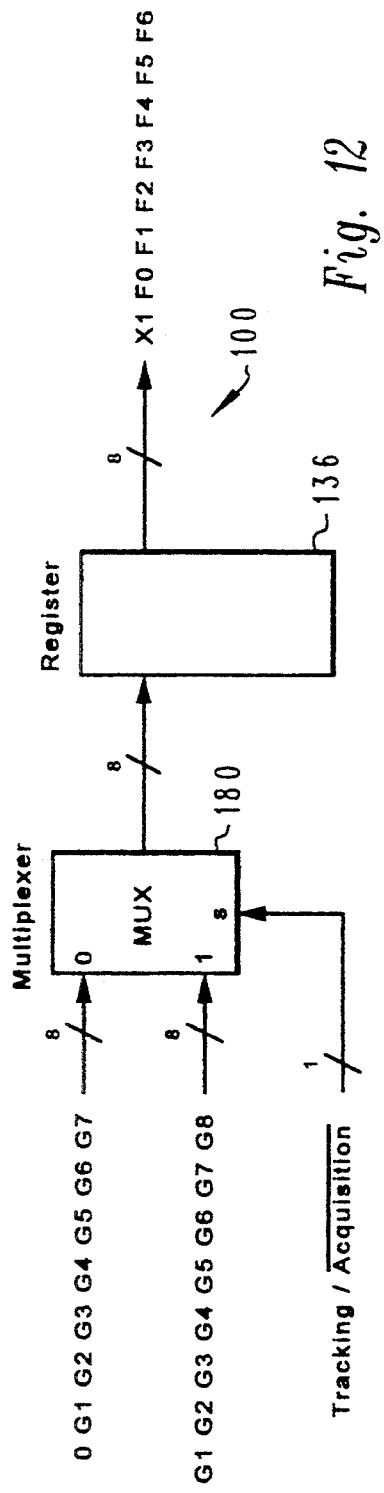
FIG. 12 is a block diagram for phase difference latch.

FIG. 12 is a block diagram of phase difference circuit 100 modified to handle tracking and acquisition modes of operation. A multiplexor 180 is introduced between register 136 and the output of tau summer 128. Multiplexor 180 operates in effect to multiply the phase adjustment signal by a factor 2 in response to the tracking-/acquisition input to the select terminal of the multiplexor going low.

Figure 13:
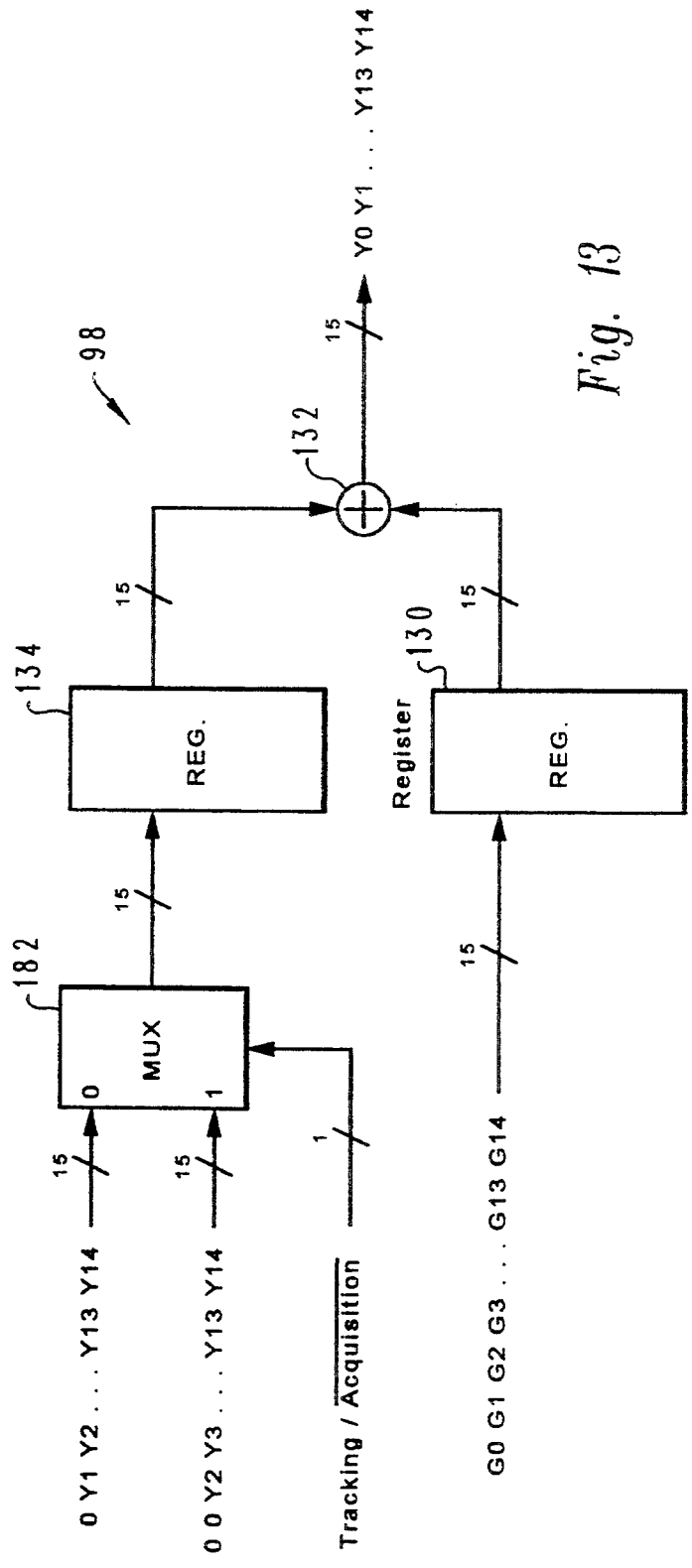
FIG. 13 is a block diagram for a phase integrating element.

FIG. 13 is a block diagram depicting modification of phase integrator 98 to handle tracking and acquisition modes of operation. A multiplexor 182 operates on inputs to register 134. Multiplexor 182 selects the proportion of the accumulated output phase signal which is returned to register 136 each sample period. During acquisition mode the register value is truncated to values less than 2 ($4\pi$ radians). During tracking the register value is truncated to values less than 1 ($2\pi$ radians).

Figure 14:
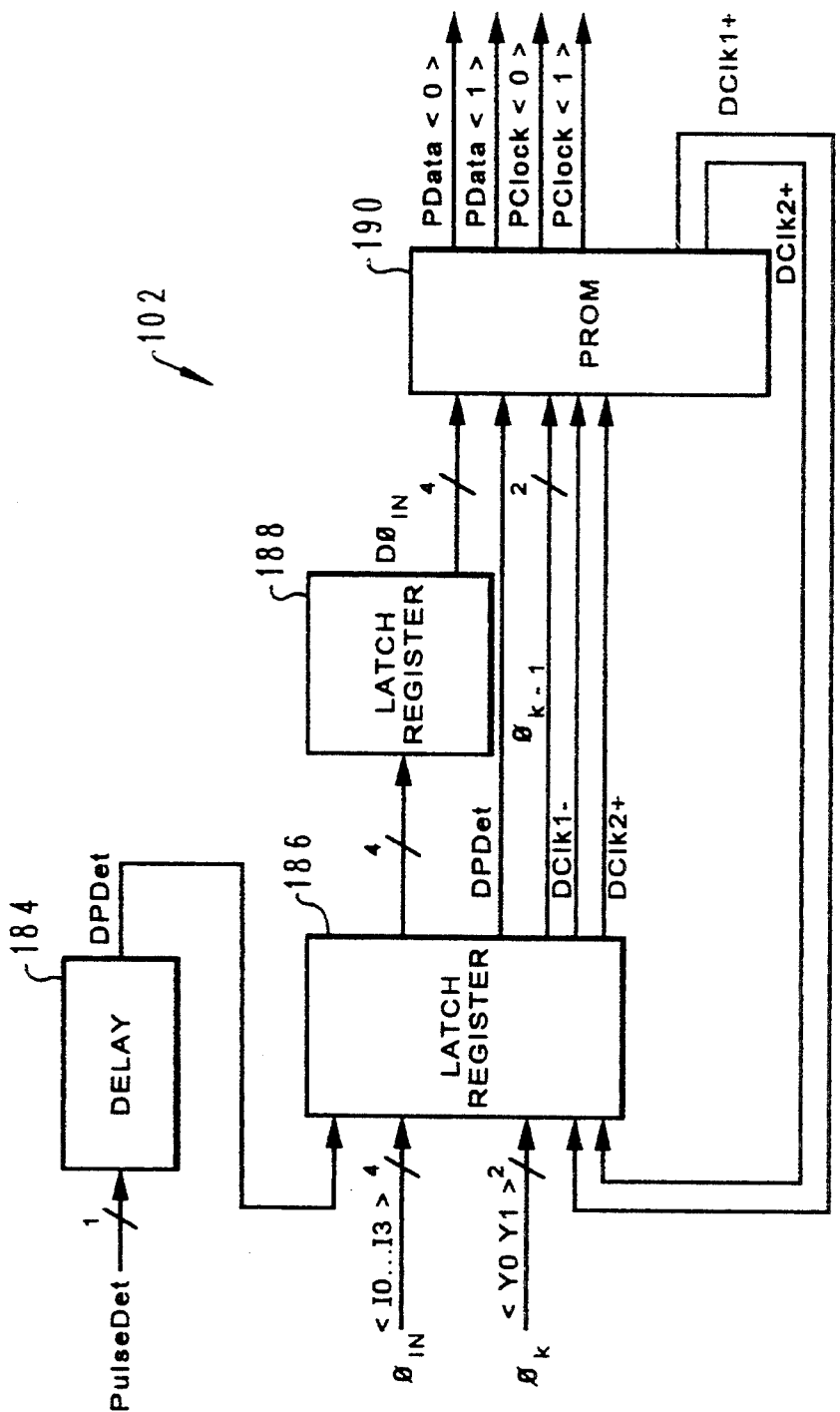
FIG. 14 is a block diagram of a data recovery unit for use with the phase-locked loop of FIG. 7.

FIG. 14 is a block diagram of Data Recovery Unit 102. Data recovery unit 102 is connected to receive the estimated phase input and the 2 most significant bits of the accumulated output phase. These values are latched and used to generate an address into a programmable read only memory PROM to produce synchronized bit stream clock and data for formatting. The pulse detect valid signal (PULSEDET) is received on a delay line 184 to synchronize it with the accumulated phase output signal $\phi_{k-1}$. The input phase estimate, the accumulated phase output signal and the delayed pulse detect valid (DPDET) are all latched on latch register 186. With each sample period the phase input estimate is latched a second time on latch register 188 to synchronize it with the accumulated phase output signal $\phi_{k-1}$. Two additional signals, DCLK1+ and DCLK2+, generated by programmable read only memory (PROM) 190, are latched into latch register 186. With each sample period, a delayed phase estimate input D$\phi_{in}$, DPDET, $\phi_{k-1}$, DCK1− and DCLK2− (DCLK1+ and DCLK2+ from the previous sample period) are applied from latches 186 and 188 as an address to PROM 190. PROM 190 generates clock and data outputs PDATA<0, 1>, PCLOCK<0, 1>, DCLK1+ and DCLK2+ in the manner set forth in the tables accompanying FIGS. 15–20.

FIGS. 15 through 20 represent phase maps of the output of the data recovery unit 102. The phase for $\phi_{k-1}$ are $\phi_k$ always greater than 0. Absent truncation, $\phi_k$ is always greater than $\phi_{k-1}$. For each figure the initial conditions are given where significant. In FIG. 14 $\phi_k$ is less than 1. Each accumulation of the value 1 in register 134 corresponds to completion of a bit cell.

Occurrence of a data pulse is indicated by DP. Slopes A, B and C represent phase accumulated per sample cell.

Figure 15:
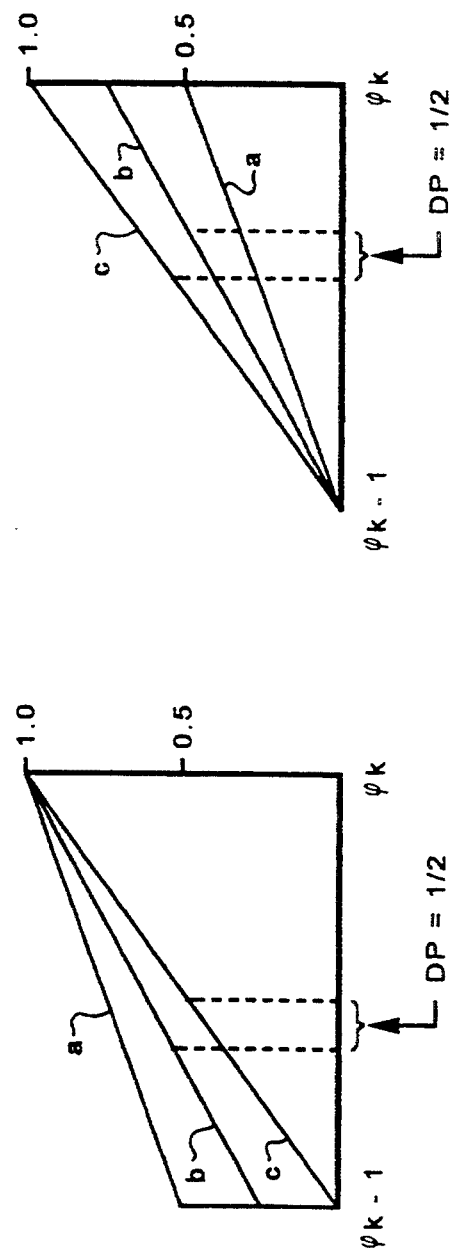
Figure 16:
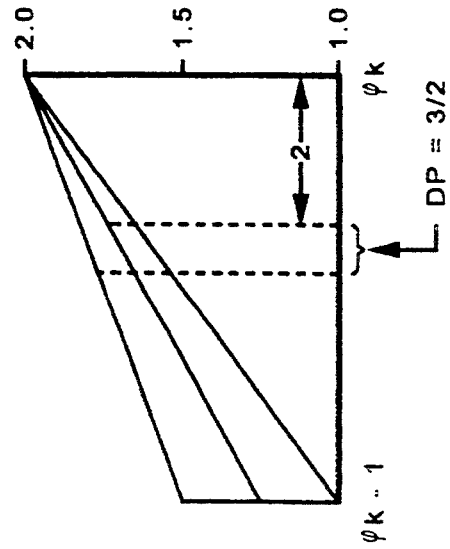
Figure 16:
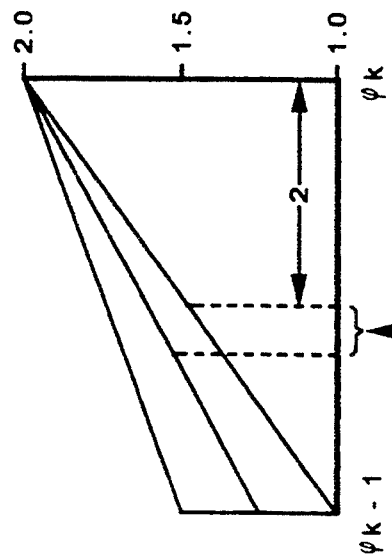

FIG. 16 is essentially the same as FIG. 15 except that the initial conditions have been changed so that both $\phi_k$ and $\phi_{k-1}$ are between 1 and 2. No data pulse output results.

Figure 17:
Figure 17:
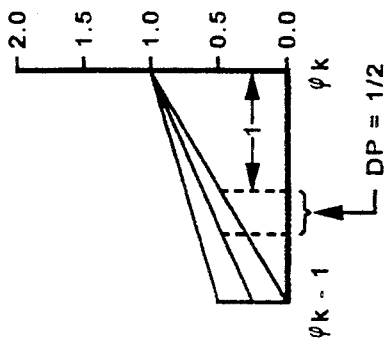
Figure 17:
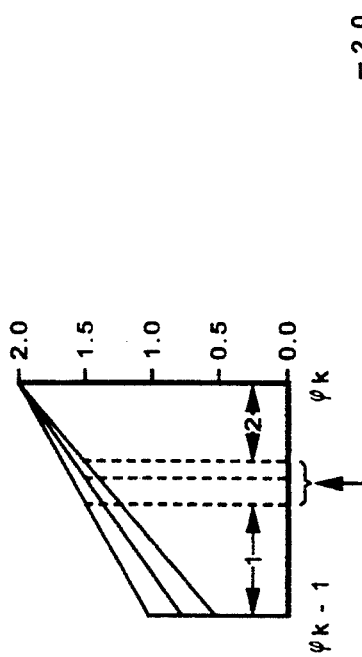
Figure 18:
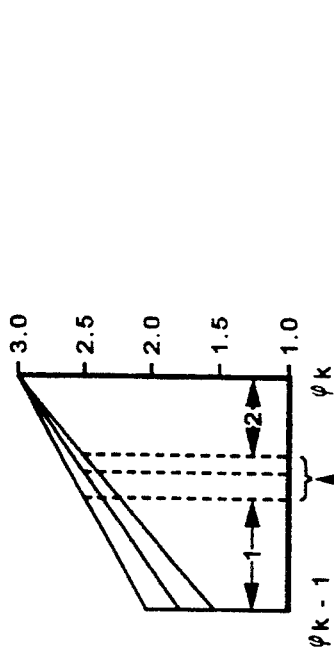
Figure 18:
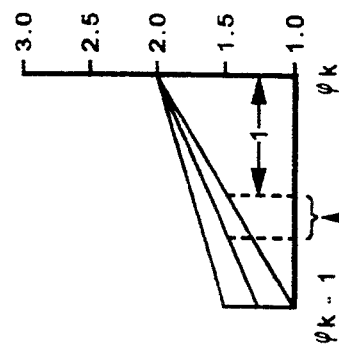
Figure 18:
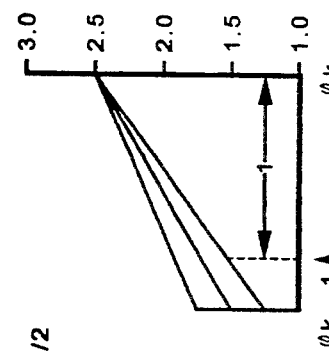
Figure 18:
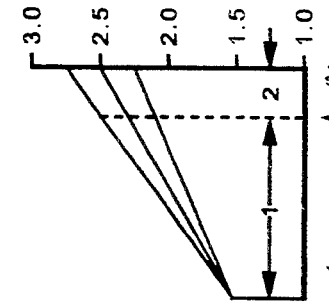
Figure 18:
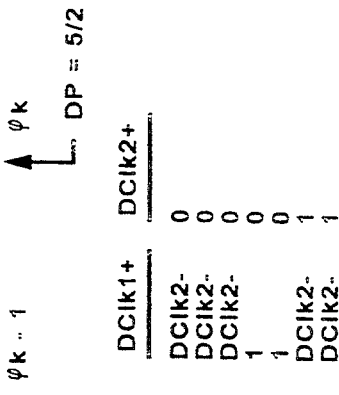

FIGS. 17 and 18 illustrates generation of an output clock pulse and data pulse

FIGS. 19 and 20 define conditions when 2 output clocks will be generated for a given set of input conditions, occurring during a sample cell.

Since the integral of the frequency of the output phase is stored in a register of the loop filter, as described above, it is easy to average the frequency of several parallel phase lock loops 20. Doing so provides a performance advantage in multichannel systems where the input data is occasionally lost to media defects or debris. This condition can cause a channel to loose input phase information, however accessing the global average frequency it can still receive frequency information from the channels that have input data. The frequency averaging operation is done by taking the frequency register value of the loop filter and averaging it with several other tracks. The global group frequency is added together and divided by the number of input loops and then sent back to the individual loop filters as the global average frequency described above. All of this may be done under the control of data format control 24.

The invention also allows monitoring instantaneous speed variations (ISV) on tape systems. Many tape systems provide read while write capability. A read transducer is mounted directly behind (relative to direction of movement of type over the transducer mounting head) the write head and is used to recover data as written for verification of accuracy. The frequency (i.e. bit cell size) on each track, and the global average frequency, can be monitored and compared to minimum and maximum thresholds. Preferably the thresholds for the global average frequency are closer together than those for individual tracks. Flags may be set if the frequency numbers fall outside the desired bounds, allowing the system to skip writing a block.

There are several advantages of the invention over other phase-locked loops. The major advantage of the ADPLL is that it is a totally digital data recovery system that requires no voltage controlled oscillator (VCO) or high-frequency clock to control the output phase or phase detector. Another advantage of the ADPLL over other PLLs is that, with minor modifications, the ADPLL can be used with either the analog channels in use today or with full digital asynchronous channels. If the effects of quantization are ignored, the ADPLL should be able to perform as well as the analog PLLs that are currently used in magnetic disk or tape recording products (and perhaps perform far better when defects and dropouts are considered).

While the invention has been particularly shown and described with reference to a preferred embodiment, it will be understood by those skilled in the art that various changes in form and detail may be made therein without departing from the spirit and scope of the invention.

What is claimed is:

1. A phase-locked loop for operating with fixed duration sample cells on run length limited code, the phase-locked loop comprising:

a phase detector which utilizes arrival time information for a raw data pulse within a sample cell a current period output phase difference signal and an accumulated output phase signal for generating a phase error signal;

a low pass loop filter taking the phase error signal as an input and generating a phase adjustment signal;

means for adding the phase adjustment signal to a ratio of the duration of the fixed sample cell and the duration of a nominal bit cell to generate an output phase difference signal; and a phase integrator taking succeeding values for the output phase difference signal with successive sample cells to accumulate the accumulated output phase signal.

2. A phase-locked loop as set forth in claim 1, further including means for normalizing the duration of the output phase difference signal relative to the duration of the sample cell.

3. A phase-locked loop as set forth in claim 2, wherein the phase integrator further comprises:

means for truncating the accumulated output phase signal.

4. A phase-locked loop as set forth in claim 3, wherein the phase detector further comprises:

means for generating an input phase estimate from the arrival time information, the output phase difference signal and the accumulated output phase signal.

5. A phase-locked loop as set forth in claim 4, wherein the input phase estimate generating means executes a relationship:

$$\phi_{in} = (\phi_k - \phi_{k-1}) \times t_{pst} + \phi_{k-1}$$

where $\phi_{in}$ is the input phase estimate, $(\phi_k - \phi_{k-1})$ is the output phase difference signal, $\phi_{k-1}$ is the accumulated output phase signal and $t_{pst}$ is the arrival time information.

6. A phase-locked loop as set forth in claim 5, wherein the phase detector further comprises:

means enabled by an indication that a valid pulse has been detected for inverting the input phase estimate to generate the phase error signal.

7. A phase-locked loop as set forth in claim 6, and further comprising:

a data recovery unit utilizing the accumulated output phase signal and the input phase estimate for recovering a clock and data for the run length limited code.

8. A phase-locked loop as set forth in claim 4, wherein the low pass filter further comprises:

means for adjusting gains of the low pass filter between a tracking mode and an acquisition mode of operation.

9. A phase-locked loop as set forth in claim 8, wherein the low pass filter comprises:

a frequency integrating channel for multiplying the phase error signal with a tracking gain or an acquisition gain, depending upon mode of operation;

an impulse channel for multiplying the phase error signal with a positive tracking gain or a larger acquisition gain, depending upon mode of operation; and a time decay channel for multiplying the phase error signal with a positive tracking gain or a null acquisition gain, depending upon mode of operation.

10. A phase-locked loop as set forth in claim 9, wherein the frequency integrating channel includes:

means for accumulating the results of the multiplication with multiplication results for prior periods.

11. A phase-locked loop as set forth in claim 9, wherein the frequency integrating channel includes:

means for summing the result of the multiplication each period with a global average frequency.

12. A data recovery channel comprising a plurality of the phase-locked loops as set forth in claim 11, connected in parallel, and further comprising means for generating the global average frequency by averaging accumulated results from the means for summing for each phase-locked loop.

13. A phase-locked loop as set forth in claim 12, and further comprising:

a data recovery unit utilizing the accumulated output phase signals and the input phase estimate for recovering a clock and data.

14. A phase-locked loop as set forth in claim 12, and further comprising:

means for setting an error flag if bit cell duration shifts from nominal bit cell duration beyond maximum and minimum duration thresholds; and means for setting an error flag if average bit cell duration for the plurality of bit cell streams shifts from nominal bit cell duration beyond average maximum and minimum duration thresholds.

* * * * *

UNITED STATES PATENT AND TRADEMARK OFFICE
CERTIFICATE OF CORRECTION

PATENT NO. : 5,442,315
DATED      : August 15, 1995
INVENTOR(S) : Robert A. Hutchins It is certified that error appears in the above-indentified patent and that said Letters Patent is hereby corrected as shown below:

At column 14, line 2, insert --,-- after "cell".

At column 14, line 35, the term "$t_{pst}$" should be --$t_{pat}$--.

At column 14, line 38, the term "$t_{pst}$" should be --$t_{pat}$--.

Signed and Sealed this

Fourteenth Day of November, 1995

*Attest:*

BRUCE LEHMAN

*Attesting Officer*  *Commissioner of Patents and Trademarks*

UNITED STATES PATENT AND TRADEMARK OFFICE
CERTIFICATE OF CORRECTION

PATENT NO. : 5,442,315
DATED : August 15, 1995
INVENTOR(S) : Hutchins

It is certified that error appears in the above-indentified patent and that said Letters Patent is hereby corrected as shown below:

Column 9, lines 28-29, replace Equation 3 with the following equation:

$$\frac{\phi_{adj}(z)}{\phi_e(z)} = \frac{(A0+A+1+A3)z^2 - (A1+A0A2+A3(1+A2))z+A2A3}{(z-1)(z-A2)} \quad -- (3)$$

Signed and Sealed this

Twelfth Day of March, 1996

*Attest:*

BRUCE LEHMAN

*Attesting Officer*     *Commissioner of Patents and Trademarks*